US011476380B2

(12) United States Patent
Lobre et al.

(10) Patent No.: US 11,476,380 B2
(45) Date of Patent: Oct. 18, 2022

(54) PHOTODETECTION DEVICE HAVING A LATERAL CADMIUM CONCENTRATION GRADIENT IN THE SPACE CHARGE ZONE

(71) Applicant: COMMISSARIAT A L'ENERGIE ATOMIQUE ET AUX ENERGIES ALTERNATIVES, Paris (FR)

(72) Inventors: Clément Lobre, Grenoble (FR); Florent Rochette, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/218,468

(22) Filed: Mar. 31, 2021

(65) Prior Publication Data
US 2021/0320216 A1 Oct. 14, 2021

(30) Foreign Application Priority Data
Apr. 9, 2020 (FR) ...................................... 20 03595

(51) Int. Cl.
*H01L 27/14* (2006.01)
*H01L 31/103* (2006.01)
(Continued)

(52) U.S. Cl.
CPC .... *H01L 31/1032* (2013.01); *H01L 31/02161* (2013.01); *H01L 31/02963* (2013.01); *H01L 31/02966* (2013.01); *H01L 31/1832* (2013.01)

(58) Field of Classification Search
CPC ........... H01L 31/1032; H01L 31/02161; H01L 31/02963; H01L 31/2966; H01L 31/1832
(Continued)

(56) References Cited

U.S. PATENT DOCUMENTS

| 4,679,063 A | * | 7/1987 | White | H01L 31/1105 257/187 |
| 10,566,366 B2 | * | 2/2020 | Rothman | H01L 27/14669 |
| 2014/0319580 A1 | * | 10/2014 | Mollard | H01L 31/02966 438/94 |

FOREIGN PATENT DOCUMENTS

| EP | 0 541 973 A1 | 5/1993 |
| EP | 2 937 902 A1 | 10/2015 |

(Continued)

OTHER PUBLICATIONS

U.S. Appl. No. 16/693,432, filed Nov. 25, 2019, US2020/0176494 A1, Badano, et al.

(Continued)

*Primary Examiner* — Calvin Y Choi
(74) *Attorney, Agent, or Firm* — Oblon, McClelland, Maier & Neustadt, L.L.P.

(57) ABSTRACT

Photo-detection device (100) including a semiconductor substrate (110) made of $Cd_xHg_{1-x}Te$, with an N-doped region (120), a P-doped region (130), and a concentrated casing (150) only located in the P-doped region and having an average cadmium concentration greater than the average cadmium concentration in the N-doped region.
According to the invention, the concentrated casing (150) has a cadmium concentration gradient, defining therein at least one intermediate gap zone (151) and at least one high gap zone (152), and the intermediate gap zone (151) is in direct physical contact with an electrical contact block (170). A significant reduction in the dark current and an optimal charge carrier collection are thus combined.

15 Claims, 6 Drawing Sheets

(51) Int. Cl.
  *H01L 31/0216* (2014.01)
  *H01L 31/0296* (2006.01)
  *H01L 31/18* (2006.01)

(58) Field of Classification Search
  USPC .......................................................... 257/431
  See application file for complete search history.

(56) References Cited

FOREIGN PATENT DOCUMENTS

| | | |
|---|---|---|
| FR | 3 023 976 A1 | 1/2016 |
| FR | 3 042 310 A1 | 4/2017 |
| WO | WO 2013/079446 A1 | 6/2013 |

OTHER PUBLICATIONS

French Preliminary Search Report dated Sep. 30, 2020 in French Application 20 03595 filed Apr. 9, 2020 (with English Translation of Categories of Cited Documents), 2 pages.

* cited by examiner

PHOTODETECTION DEVICE HAVING A LATERAL CADMIUM CONCENTRATION GRADIENT IN THE SPACE CHARGE ZONE

TECHNICAL FIELD

The invention relates to the field of infrared photodiodes made of $Cd_xHg_{1-x}Te$ ($0<x<1$), used for detecting an infrared radiation particularly for infrared imaging applications.

Prior Art

A photodiode comprises a semiconductor material substrate, wherein a PN junction separates an N-doped region from a P-doped region. At thermodynamic equilibrium, a space charge zone, devoid of free carriers, extends on either side of the PN junction and induces an intense electric field in the photodiode.

In operation, one from the N-doped region and the P-doped region forms an absorption region. When a photon of adapted wavelength is absorbed in the absorption region, a so-called minority carrier is created therein. This minority carrier diffuses in the substrate until it reaches the space charge zone, where it is accelerated by the intense electric field to the other doped region. It is recombined in this other region forming an electric carrier recombination current. A photodiode is only sensitive in a defined range of wavelengths, which is dependent on the band gap, or gap, in the absorption region. A low gap value in the absorption region ensures sensitivity of the photodiode to large wavelengths.

The dark current is a defect of photodiodes caused by thermal agitation which supplies sufficient energy to form an electron-hole pair by spontaneous generation. If this electron-hole pair is formed in the space charge zone, there is formation of an electrical carrier recombination current which does not correspond to a photon absorption. A high gap value in the space charge zone ensures a reduced dark current.

Furthermore, it is known that in a semiconductor substrate made of $Cd_xHg_{1-x}Te$ (alloy of cadmium, mercury and tellurium, where $0<x<1$), the gap is dependent on the cadmium concentration. The greater this concentration, the greater the gap.

A person skilled in the art therefore had the idea of producing photodiodes made of $Cd_xHg_{1-x}Te$, with an absorption region having a low cadmium content, so that the photodiode is sensitive to large wavelengths, and a portion having a high cadmium content. In operation, at least a part of the space charge zone extends into the portion having a high cadmium content, which makes it possible to obtain a reduced dark current. An example of such a photodiode is described in patent application WO 2013/079446. In this document, the absorption region is N-doped. A casing having a high cadmium content extends into the P-doped region, with a substantially constant cadmium concentration. The casing is obtained by covering a substrate made of $Cd_xHg_{1-x}Te$ by a cadmium-rich layer, and carrying out interdiffusion annealing during which the cadmium atoms of the cadmium-rich layer will diffuse in the substrate, very preferably in the P-doped region. Throughout the document "cadmium-rich" means consisting of a material wherein at least one out of three atoms is a cadmium atom, preferably one out of two atoms.

A drawback of this solution is that it requires a compromise on the composition of the casing, to prevent the latter forming a potential barrier impeding the diffusion of the minority carriers in the space charge zone. Therefore, it is necessary to ensure that the cadmium concentration in the casing does not exceed a critical threshold beyond which the sensitivity of the photodiode is substantially affected. This results in the need for precise control of the annealing conditions, to prevent the diffusion of an excessively large quantity of cadmium to the P-doped region.

An aim of the present invention is to provide a photodetection device based on $Cd_xHg_{1-x}Te$, which offers both sensitivity to large wavelengths and a reduced dark current, and which does not have the drawbacks of the prior art.

A further aim of the present invention is to provide a method for manufacturing such a device.

DESCRIPTION OF THE INVENTION

This aim is achieved with a photodetection device having at least one pixel, including a semiconductor substrate made of $Cd_xHg_{1-x}Te$ ($0<x<1$), said substrate including for each pixel:
- an N-doped region, dedicated to the absorption of incident photons;
- a P-doped region, forming a PN junction with the N-doped region and flush with a so-called top face of the substrate;
- an electrical contact block, made of metal, in direct physical contact with the P-doped region; and
- a concentrated casing, only located in the P-doped region and having an average cadmium concentration greater than the average cadmium concentration in the N-doped region.

According to the invention, in each pixel of the photodetection device:
- the concentrated casing has a cadmium concentration gradient, defining therein at least one intermediate gap zone and at least one high gap zone;
- the intermediate gap zone has an average cadmium concentration strictly less than the average cadmium concentration in the high gap zone; and
- each intermediate gap zone is in direct physical contact with the electrical contact block.

As each intermediate gap zone is in direct physical contact with the electrical contact block. It is therefore understood that the cadmium concentration gradient is a lateral gradient, i.e. a variation of the cadmium concentration in planes parallel with the substrate plane.

Each pixel defines a photodiode. In each pixel, the P-doped region is shallow with regard to the lateral span thereof, with for example a ratio greater than or equal to three between the depth thereof and the diameter thereof. The lateral span denotes the maximum width, respectively the maximum length thereof, both defined in a plane parallel with the substrate plane.

In each pixel, the spectral sensitivity range is defined by the cadmium concentration in the N-doped region. This concentration is fixed freely, and so as to detect photons at the desired wavelengths, preferably in the infrared range.

As in the prior art mentioned in the introduction, each pixel includes a casing having a higher cadmium concentration, located only in the P-doped region, and named "concentrated casing" here. The average gap in the concentrated casing is therefore greater than the average gap in the N-doped region. In operation, the space charge zone extends at least partially into the concentrated casing, which makes it possible to reduce the dark current.

According to the invention, in each pixel, the concentrated casing includes at least one intermediate gap and at least one high gap zone. In operation, the space charge zone therefore extends partially into the intermediate gap zone, and partially into the high gap zone.

The intermediate gap zone has an average cadmium concentration strictly less than the average cadmium concentration in the high gap zone. The average gap in the intermediate gap zone is therefore less than the average gap in the high gap zone. Furthermore, the intermediate gap zone is in direct physical contact with the electrical contact block. So that carrier collection remains possible, it is therefore simply necessary for the average gap in the intermediate gap zone not to form a potential barrier impeding minority carrier diffusion. It is not a problem, on the other hand, that the average gap in the high gap zone impedes minority carrier diffusion. In other words, the reduction of the dark current is carried out, at least, by the high gap zone, whereas carrier collection is carried out, at least, by the intermediate gap zone.

Thus, in the high gap zone, the problems associated with seeking a compromise between a high gap to minimise the dark current and a low gap to still enable carrier collection are avoided.

Furthermore, since the average gap in the high gap zone can exceed a threshold limit beyond which it forms a potential barrier for minority carriers, the average value of the gap in the concentration casing can be increased compared to the prior art. The dark current is therefore reduced further.

Finally, since the high gap zone alone ensures a substantial reduction in the dark current, the average gap in the intermediate gap zone can be narrow enough to ensure satisfactory charge carrier collection regardless of the operating conditions (temperature, photon flux, etc.).

The concentrated casing is obtained simply by covering the substrate with a cadmium-rich structured layer and by carrying out an inter-diffusion annealing. During this annealing, the cadmium atoms of the cadmium-rich structured layer will diffuse into the substrate, mainly in the P-doped region. The cadmium concentration gradient is obtained thanks to one or more through opening(s) bored in the cadmium-rich structured layer.

Preferably, the photo-detection device according to the invention further includes a structured coating covering the top face of the substrate, and:
- the structured coating includes a cadmium-rich layer, consisting of an alloy comprising cadmium and in direct physical contact with the semiconductor substrate;
- the structured coating includes at least one through opening; and
- in each pixel, each intermediate gap zone of the concentrated casing is topped with a respective through opening of the structured coating.

The structured coating can include several stacked layers, including a sealing layer, separate from the cadmium-rich layer and capable of blocking the passage of doping elements inside the semiconductor substrate.

The photo-detection device according to the invention advantageously includes at least two pixels, and each pixel includes the same number of through opening(s) in the structured coating, distributed in the same way on the pixel and having the same dimensions from one pixel to another.

In each pixel, each intermediate gap zone is preferably surrounded laterally by a part at least of the at least one high gap zone.

In at least one pixel, the concentrated casing can comprise a single intermediate gap zone and a single high gap zone, with the single intermediate gap zone surrounded laterally by the single high gap zone.

Additionally or alternatively, in at least one pixel, the concentrated casing can comprise a single intermediate gap zone and two high gap zones, with the intermediate gap zone which forms an open volume at the centre and with the two high gap zones respectively around and at the centre of the intermediate gap zone.

Additionally or alternatively, in at least one pixel, the concentrated casing can comprise a plurality of intermediate gap zones, and a high gap zone which extends around and between the intermediate gap zones.

Preferably, in each pixel, the minimum cadmium concentration value in the concentrated casing is strictly greater than the minimum cadmium concentration value in the N-doped region.

The photo-detection device according to the invention advantageously includes a plurality of pixels which all have the same cut-off wavelength.

The semiconductor substrate can have a mesa topology, with, in each pixel, a respective mesa block receiving the P-doped region.

The invention also covers a method for manufacturing a photo-detection device according to the invention, which comprises the following steps:
a) producing, on the semiconductor substrate, a structured coating including at least one through opening, with said structured coating which includes a cadmium-rich layer, consisting of an alloy comprising cadmium and in direct physical contact with the semiconductor substrate;
b) annealing the whole including the semiconductor substrate and the structured coating;
the method further comprising producing, in each pixel, a PN junction which separates the N-doped region and the P-doped region, with the P-doped region located in relation to at least one from the at least one through opening of the structured coating, and the annealing carrying out a selective inter-diffusion of the cadmium from the structured coating to the P-doped region of each pixel.

In each pixel, producing the PN junction advantageously includes a step of injecting doping elements into the semiconductor substrate, this step being carried out after step a) and the doping elements being injected through at least one through opening of the structured coating.

The structured coating can include several stacked layers, including a sealing layer, separate from the cadmium-rich layer and capable of blocking the passage of doping elements inside the semiconductor substrate.

Preferably, the method further includes, for each pixel, a step of producing the electrical contact block carried out after step b), with the electrical contact block which extends into each through opening of the structured coating in said pixel.

BRIEF DESCRIPTION OF THE DRAWINGS

The present invention will be understood more clearly on reading the description of embodiment examples given merely by way of indication and in no way limitation with reference to the appended drawings wherein.

DETAILED DESCRIPTION OF SPECIFIC EMBODIMENTS

Hereinafter, an average cadmium concentration denotes an average volume concentration of cadmium atoms.

For easier reading, the axes of an orthonormal frame (Oxyz) have been represented in some of the figures.

Figure 1A:
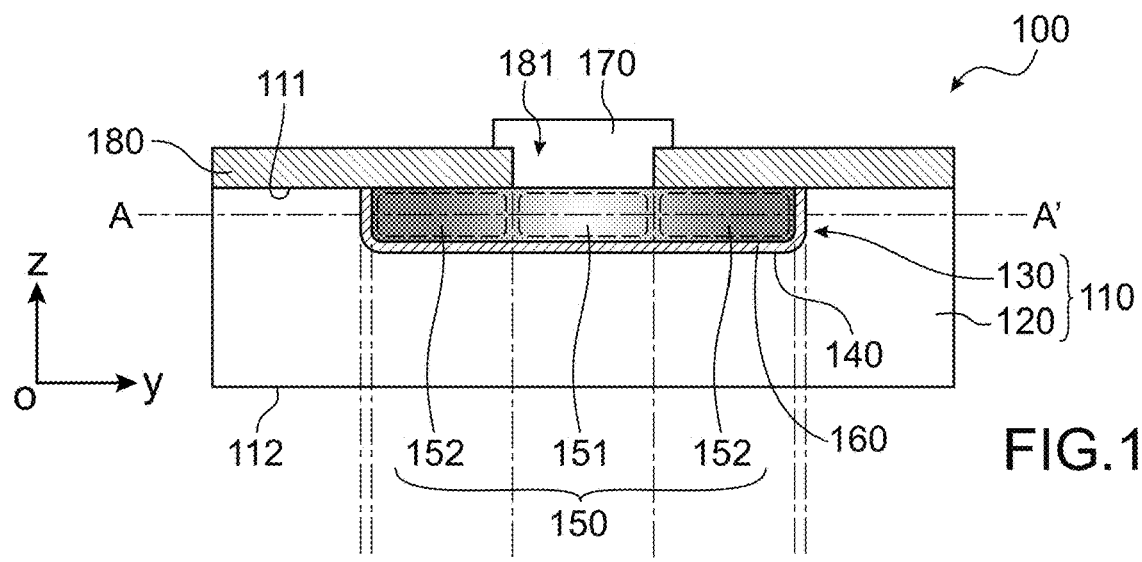
FIG. 1A illustrates schematically a first embodiment of a photo-detection device according to the invention, according to a sectional view in a transverse plane.

FIG. 1A illustrates, according to a sectional view in a plane (yOz), a first embodiment of a photo-detection device 100 according to the invention.

The photo-detection device 100 includes a substrate 110 made of semiconductor material, made of an alloy of cadmium, mercury and tellurium of type $Cd_xHg_{1-x}Te$, where x is between 0 and 1, excluding the bounds. The substrate 110 has here two large faces parallel with the plane (xOy), which respectively define a top face 111 and a bottom face 112 of the substrate 110 (wafer type thin substrate).

The substrate 110 is formed here by an N-doped region 120, and at least one P-doped region 130. Each P-doped region 130, forms a respective PN junction 140 with the N-doped region 120. Each PN junction 140 defines a photodiode, and each photodiode corresponds to a respective pixel of the photo-detection device 100. Here, the photo-detection device 100 includes a single pixel.

The N-doped region 120, forms a so-called absorption region, N-doped here with indium ions. In operation, incident photons on the photo-detection device 100 penetrate the substrate 110, and form an electron-hole pair in the N-doped region 120. The N-doped region 120 has a substantially constant cadmium concentration throughout the volume thereof. It consists of $Cd_xHg_{1-x}Te$, where x is preferably between 0.15 and 0.95, for example x=0.3. The value of x is for example between 0.25 and 0.4 for a sensitivity in the middle infrared region (i.e. at wavelengths between 3 μm and 9 μm).

The P-doped region 130 is P-doped with acceptor doping elements belonging preferably to column V of the periodic table of elements, for example arsenic. The P-doped region 130 is flush with the top face 111 of the substrate 110. It has a shape of thin volume, with a reduced dimension along the axis (Oz) of the depth in the substrate 110 and large dimensions along the axes (Ox) and (Oy). Preferably, it has a depth at least ten times less than the diameter thereof. The depth thereof can be between 100 nm and 1000 nm, for example equal to 200 nm. The diameter thereof can be between 1 μm and 25 μm, for example equal to 10 μm. The P-doped region 130 consists of $Cd_xHg_{1-x}Te$, where x is preferably between 0.15 and 0.95. The value of x is variable, according to the location in question in the P-doped region 130.

A concentrated casing 150 is defined, located only inside the P-doped region. The concentrated casing 150 extends inside the P-doped region 130, from the top face 111 of the substrate 110 to the bottom of the casing, on the side opposite said top face of the substrate. The bottom of the concentrated casing is located at the PN junction 140, preferably at less than 20 nm therefrom.

The average cadmium concentration in the concentrated casing 150 is strictly greater than the average cadmium concentration in the N-doped region 120. Thus, the average cadmium concentration in the concentrated casing 150 corresponds to a value V1 of x, the average cadmium concentration in the N-doped region corresponds to a value V2 of x, and V1 is strictly greater than V2. For example, a ratio greater than or equal to 1.5 between V1 and V2 is obtained.

The concentrated casing 150 has a cadmium concentration gradient. In particular, the value taken by x varies along the axes (Ox) and (Oy), in the concentrated casing 150 and in planes parallel with the top face 111 of the substrate 110. Said gradient can therefore be referred to as "lateral gradient". The value taken by x varies in the concentrated casing 150 between an upper value $x_{max}$ and a lower value $x_{min}$ strictly less than $x_{max}$.

The upper value $x_{max}$ is preferably between 1.5 and 5 times V2 (average cadmium concentration in the N-doped region), or between 1.5 and 3 times V2, while remaining less than the unit. Advantageously, it remains between 0.15 and 0.95.

The lower value $x_{min}$ is greater than or equal to the minimum cadmium concentration in the N-doped region, preferably strictly greater than this minimum concentration. In practice, the minimum cadmium concentration in the N-doped region can be equal to V2, the average cadmium concentration in the N-doped region. Nevertheless, $x_{min}$ must not exceed a limit threshold beyond which a potential barrier blocking the diffusion of the charge carriers is formed (under normal operating conditions of the photodiode, when a polarisation voltage is applied thereto). Preferably, a ratio between $x_{min}$ and V2 is between 1.1 and 3, more preferably between 1.2 and 2.5.

The cadmium concentration gradient makes it possible to define at least one so-called intermediate gap zone 151 and at least one so-called high gap zone 152, which form the concentrated casing 150 together. Each high gap zone 152 therefore has an average cadmium concentration which corresponds to a value V3 of x, each intermediate gap zone 151 has an average cadmium concentration which corresponds to a value V4 of x, and V3 is strictly greater than V4. Preferably, a ratio between V3 and V4 is between 1.2 and 5, preferably between 1.5 and 3. Here, the concentrated casing 150 is formed by a single intermediate gap zone 151 and a single high gap zone 152, with the single intermediate gap zone 151 surrounded laterally by the single high gap zone 152.

Throughout the document, the expression "surrounded laterally" means surrounded in planes parallel with the substrate plane.

The substrate 110 also includes an intermediate zone 160, which extends here laterally (along the axes (Ox) and (Oy)) and vertically (along the axis (Oz)), between the edge of the concentrated casing 150 and the PN junction 140. In this intermediate zone, the cadmium concentration decreases rapidly from a cadmium concentration at the edge of the concentrated casing 150. The distance between the edge of the concentrated casing 150 and the PN junction 140 defines a span of the intermediate zone 160. This span has a reduced value, preferably less than 200 nm. Such an intermediate zone 160 can extend from one side and/or the other of the PN junction 140, in the P-doped region and/or in the N-doped region. In any case, the intermediate zone occupies less than 10% of the volume of the P-doped region, and the concentrated casing occupies more than 90% of the volume of the P-doped region. Hereinafter, the presence of this intermediate zone 160 is disregarded, and, for simplification purposes, the concentrated casing 150 is considered to extend over the entire volume of the P-doped region.

Figure 1B:
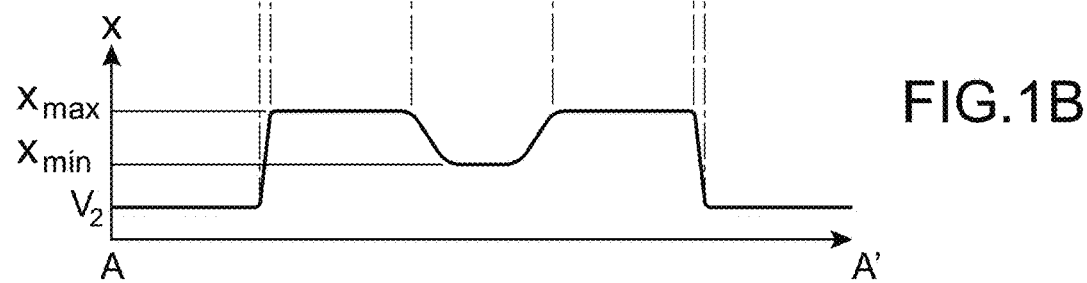
FIG. 1B illustrates an example of cadmium distribution in the device in FIG. 1A.
Figure 1C:
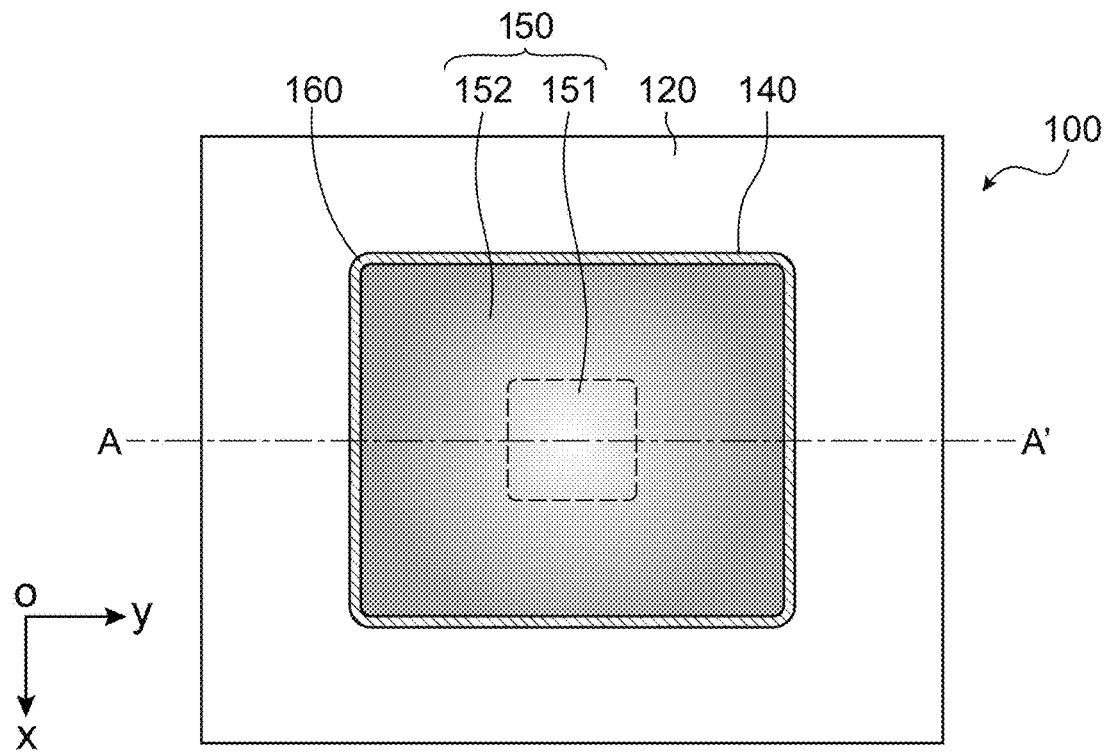
FIG. 1C illustrates schematically the device in FIG. 1A, according to a sectional view in plane parallel with the substrate.

In FIG. 1C, the photo-detection device 100 is represented, according to a sectional view in a plane parallel with the plane (xOy) passing through the concentrated casing 150. The intermediate gap zone 151 entirely surrounded by the high gap zone 152 is clearly observed, along with the fine intermediate zone 160 between the concentrated casing 150 and the N-doped region 120.

The substrate 110 is covered, on the side of the top face 111 thereof, with a structured coating 180 which extends directly onto the substrate 110. The structured coating 180 includes at least one through opening per pixel, here a single through opening 181 in the pixel. Each pixel includes as many through opening(s) as intermediate gap zone(s) in the concentrated casing, each through opening being located in relation to a respective intermediate gap zone of said casing.

The structured coating 180 includes a cadmium-rich layer, consisting of an alloy comprising cadmium, for example CdTe, CdS, CdSe, CdZnSe, etc. This cadmium-rich layer extends directly onto the substrate 110, in direct physical contact therewith. Here, the structured coating 180 consists of this single cadmium-rich layer. In alternative embodiments not shown, it can include further layers, particularly a sealing layer capable of blocking the passage of doping elements inside the substrate (see FIG. 6).

Each pixel also includes an electrical contact block 170, in direct physical contact with each intermediate gap zone of the concentrated casing belonging to the same pixel. In each pixel, the electrical contact block 170 extends from the side of the top face 111 of the substrate 110, entering each through opening 181 of the structured coating to come into contact with the corresponding intermediate gap zone 151.

In each through opening 181, the electrical contact block 170 can cover all or part of the surface of the substrate left free thereby. Preferably, the electrical contact block 170 entirely fills each through opening 181 of the structured coating in the pixel. In each through opening 181, the electrical contact block 170 can rest against the top face 111 of the substrate 110, or sink slightly into the intermediate gap zone. Furthermore, the electrical contact block 170 can extend only inside the through opening 181, or protrude just on the top of the structured coating 180. When the pixel includes several intermediate gap zones and several through openings, the electrical contact block includes contact portions located in said through openings and one or more connector portions located between said through openings and on the top of the structured coating 180.

In each pixel of the photo-detection device according to the invention, each intermediate gap zone 151 of the concentrated casing is therefore topped by a respective through opening 181 of the structured coating, and in direct physical contact with the electrical contact block 170 through said through opening 181.

In operation, the space charge zone extends on either side of the PN junction 140, partially in the concentrated casing 150. Thanks to the higher average cadmium concentration in the concentrated casing 150, the photo-detection device 100 can detect photons at large wavelengths while having a reduced dark current. In each pixel, the charge carrier collection is carried out at the at least one intermediate gap zone 151, connected to the electrical contact block 170. Consequently, the potential presence of a potential barrier at the high gap zone 152 does not prevent effective charge carrier collection. It is therefore possible to increase an average value of the gap in the space charge zone, compared to the prior art, and thus reduce the dark current for the same spectral sensitivity range. It is furthermore possible to relax the manufacturing tolerances since the value of the gap is only a sensitive parameter in only a part of the concentrated casing.

In FIG. 1B, an example of variation of the cadmium concentration x has been represented, along an axis AA' extending in a plane parallel with the plane (xOy) and passing through the concentrated casing 150. In FIG. 1B, two sudden transitions are observed between the low value V2 and the value $x_{max}$, at the intersections between the axis AA' and the intermediate zone 160. In this example, the cadmium concentration is constant at the value V2, in the entire volume of the N-doped region less the overlap volume between the N-doped region and the intermediate zone. In the concentrated casing, the concentration x has two stages at the value $x_{max}$ framing a high-gradient zone wherein the concentration x passes from the value $x_{max}$ to the value $x_{min}$, then from the value $x_{min}$ to the value $x_{max}$. It is possible to have a stage at the value $x_{min}$.

The intermediate gap zone can be considered to correspond to the portions of the concentrated casing wherein x is between $x_{min}$ and a threshold value strictly less than $x_{max}$. The high gap zone then corresponds to the remainder of the concentrated casing. Similarly, the high gap zone can correspond to the portions of the concentrated casing wherein x is substantially equal to $x_{max}$. The high gap zone then extends in relation to the solid portions of the structured coating, whereas each intermediate gap zone extends in relation to a respective through opening of the structured coating. Obviously, it is possible to define the intermediate gap and high gap zones otherwise, for example so that the high gap zone also extends in relation to peripheral regions of the through openings. In any case, it is advantageous that the volume of the concentrated casing at the concentration $x_{max}$ is as large as possible, and occupies for example more than half of the volume of the P-doped region so as to minimise the dark current.

In this first embodiment, an overlap surface area between the P-doped region and the structured coating is different to zero. In an extreme case, this overlap surface area can be zero. In this case, the edges of the P-doped region can be directly adjacent to the edges of a through opening of the structured coating, at the top face 111 of the substrate 110. In any case, this overlap surface area is a surface area between a minimum and a maximum, where this minimum can take the value zero, and where the maximum is advantageously equal to the surface area of the P-doped region flush with the top face of the P-doped region less 0.5 µm².

Figure 2A:
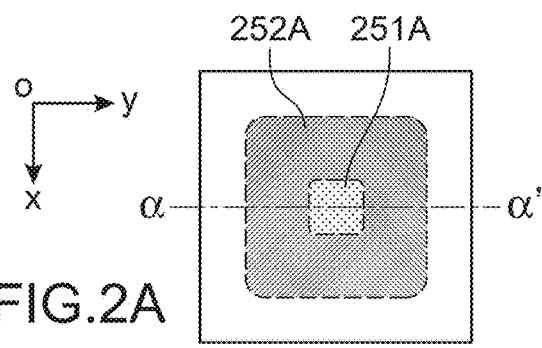
FIG. 2A, FIG. 2A', FIG. 2B, FIG. 2B', FIG. 2C', and FIG. 2C illustrate schematically various alternative embodiments of the device in FIG. 1A.
Figure 2A:
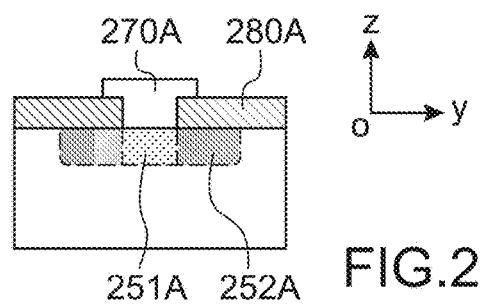

FIGS. 2A, 2A' to 2C, 2C' illustrate very schematically different alternative distributions of the intermediate gap and high gap zones in a pixel of the device according to the invention.

In FIGS. 2A and 2A', the intermediate gap and high gap zones are distributed as in the example in FIG. 1A. FIG. 2A is a sectional view of the pixel, in a plane (x0y) parallel with the substrate plane. FIG. 2A is a sectional view of the same pixel, in a plane (y0z) orthogonal to the substrate plane and passing through the axis aa'. In this alternative embodiment, the concentrated casing is formed by a single intermediate gap zone 251A and a single high gap zone 252A. The intermediate gap zone 251A extends to the centre of the concentrated casing, entirely surrounded laterally by the high gap zone 252A. The structured coating 280A includes a single through opening, located in relation to the intermediate gap zone 251A. The electrical contact block 270A fills this single through opening. This alternative embodiment makes it possible to minimise the volume of the intermediate gap zone, and makes it possible to ensure optimal charge carrier collection and a minimal dark current.

Figure 2B:
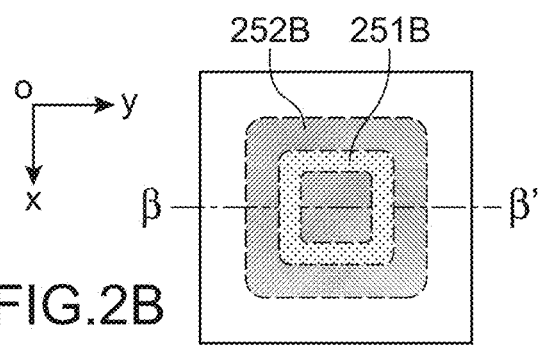
Figure 2B:
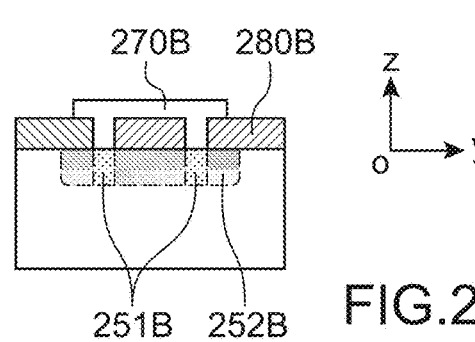

In FIGS. 2B and 2B', the concentrated casing is formed of a single intermediate gap zone 251B and two high gap zones 252B. FIG. 2B is a sectional view of the pixel, in a plane (x0y) parallel with the substrate plane. FIG. 2B' is a sectional view of the same pixel, in a plane (y0z) orthogonal to the substrate plane and passing through the axis ββ'. The intermediate gap zone 251B forms an open volume at the centre, centred on the pixel. The high gap zones 252B extend respectively inside and around this open volume at the centre. The structured coating 280B includes a single through opening, which surrounds a solid portion of the structured coating and which is located in relation to the intermediate gap zone 251B. The electrical contact block 270B fills this single through opening. The charge carriers are collected in the intermediate gap zone, on the periphery of the pixel. Counterintuitively, this positioning of the collection zones favours a good modulation transfer function.

Figure 2C:
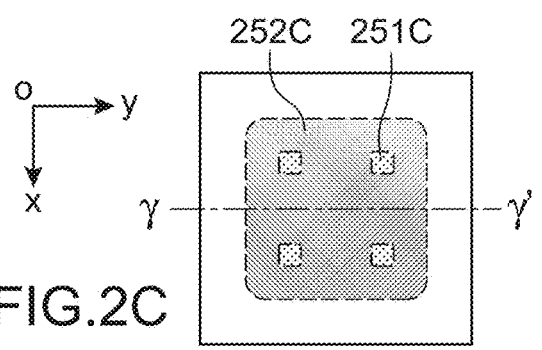
Figure 2C:
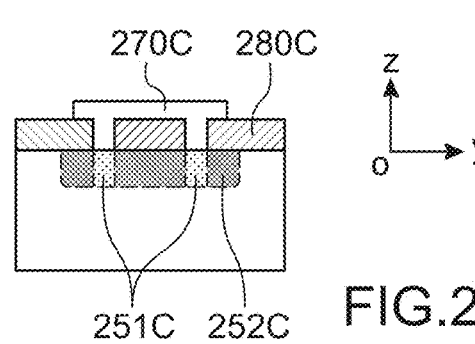

In FIGS. 2C and 2C', the concentrated casing is formed of four separate intermediate gap zones 251C and one high gap zone 252C. FIG. 2C is a sectional view of the pixel, in a plane (x0y) parallel with the substrate plane. FIG. 2C' is a sectional view of the same pixel, in a plane (y0z) orthogonal to the substrate plane and passing through the axis γγ'. The intermediate gap zones 251C extend respectively to the four corners of the pixel. The high gap zone 252C extends between and around the intermediate gap zones 251C. The structured coating 280C includes four through openings, located in relation to a respective intermediate gap zone 251C. The electrical contact block 270C fills these four through openings and also covers a structured coating part. This alternative embodiment makes it possible to combine a good modulation transfer function and a minimal dark current, thanks to the positioning of the intermediate gap zones at the periphery of the pixel and on a reduced volume. According to alternative embodiments not shown, the pixel has a non-square shape, always with a respective intermediate gap zone at each corner of the pixel.

In each of these alternative embodiments, the distribution of the through openings in the structured coating is similar to the distribution of the intermediate gap zones, with at least one through opening in each pixel of the photo-detection device. A through opening can surround a solid portion of the structured coating.

Figure 3:
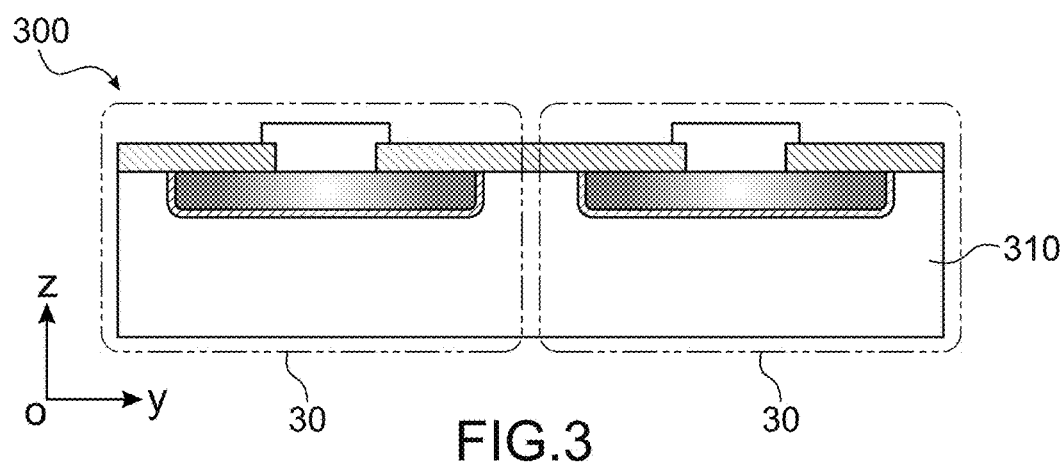
FIG. 3 illustrates schematically a second embodiment of a photo-detection device according to the invention, according to a sectional view in a transverse plane.

FIG. 3 illustrates schematically a second embodiment of a photo-detection device 300 according to the invention, according to a sectional view in a transverse plane (y0z). This second embodiment only differs from the first embodiment in that it includes several pixels 30, sharing the same substrate 310. All the pixels 30 are topped with the same set of at least one through opening in the structured coating. In particular, each of the sets of at least one through opening includes the same number of through opening(s), distributed in the same way on the pixel, with the same dimensions from one pixel to another. All the pixels 30 furthermore have the same cut-off wavelength, with the same minimum cadmium concentration value in the N-doped region.

In the different examples illustrated above, the P-doped region has a substantially square cross-section in a plane (x0y) parallel with the substrate plane. This example is not restrictive, and numerous other shapes of P-doped region can be used without leaving the scope of the present invention, for example a P-doped region of round or oval cross-section in a plane (x0y) parallel with the plane of the substrate. Similarly, the at least one through opening located in relation to the P-doped region, in the structured coating, can have a cross-section other than square, for example round or oval, in a plane (x0y) parallel with the substrate plane. In any case, the cross-section of the through opening is preferably a homothetic transformation of the cross-section of the P-doped region. Similarly, the invention is not limited to one or more pixels of square cross-section in a plane (x0y) parallel with the substrate plane.

With reference to FIGS. 4A to 4F, the steps of a first embodiment of a method for manufacturing a photo-detection device according to the invention will now be described.

Figure 4A:
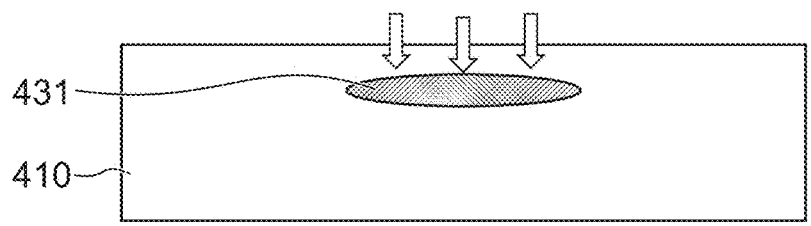
FIG. 4A, FIG. 4B, FIG. 4C, FIG. 4D, FIG. 4E and FIG. 4F illustrate the steps of a first embodiment of a method according to the invention, for manufacturing a photo-detection device such as that in FIG. 1A.

In a first step, an ion implantation of doping elements is carried out in a semiconductor substrate 410 made of $Cd_xHg_{1-x}Te$ (FIG. 4A). The substrate 410 initially has an N-type doping on the entire volume therefore, carried out for example with indium ions. The implanted acceptor doping elements are of acceptor type, for example arsenic or any other element belonging to column V of the periodic table of elements (phosphorus, antimony, bismuth, etc.). The implantation conditions are standard, for example an energy of 500 keV and an implantation dose of $2·10^{15}$ atoms/cm². An implantation zone 431 is thus obtained in the substrate 410. The doping elements are implanted in the substrate at a so-called top face thereof.

A structured coating 480 as described above is then produced (FIG. 4B), on the top face of the substrate 410. The structured coating consists here of CdTe, and includes at least one through opening 481.

The structured coating 480 can be produced by deposition or epitaxy of a solid layer, followed by etching through an etching mask to form the at least one through opening 481. The etching can be a chemical etching using a bromine solution, wherein the etching depth is adjusted by adjusting the duration of the chemical etching, or a selective chemical etching, wherein the substrate 410 is not sensitive to etching, or an ion or plasma type dry etching, etc. The etching mask is typically made of resin. According to further alternative embodiments, the structured coating 480 is produced using a resin mask, deposited directly on the substrate then coated with CdTe. When the resin mask is removed, the CdTe is removed at the same time apart from at the locations of the openings in the resin mask, which forms a structured CdTe layer on the substrate (lift-off technique).

A diffusion annealing and acceptor doping element activation are then carried out. This annealing is performed at about 400° C., and forms mercury holes throughout the substrate. Following the annealing, the substrate 410 is therefore formed by a region 421, weakly P-doped due to the mercury holes, and at least one P-doped region 430, strongly P-doped thanks to the acceptor doping elements. In FIG. 4C, the overlap surface 482 between the P-doped region 430 and the solid portions of the structured coating 480 have been identified.

Cadmium inter-diffusion annealing is then carried out (FIG. 4D), during which the cadmium atoms of the structured coating 480 diffuse to the substrate (and mercury atoms from the substrate diffuse to the structured coating 480). This annealing is carried out preferably at a temperature greater than 100° C., but less than 500° C. for example at a temperature equal to 300° C. This annealing is carried out for a duration greater than one minute, preferably greater than 24 hours, for example between 30 hours and 50 hours.

The cadmium diffusion is an isotropic ion diffusion, with a diffusion length which involves an acceleration term due to the Fermi level. For a P-doped material, this term increases with the carrier density. (For an intrinsic or N-doped material, this term takes the value 1, and therefore does not intervene). Cadmium therefore diffuses virtually only in the P-doped region 430, where the carrier density is very high compared to the weakly P-doped region 421 (subsequently N-doped following an annealing under saturating mercury vapour pressure, as described hereinafter with reference to FIG. 4E). Therefore, selective inter-diffusion is being discussed. Cadmium diffuses into the substrate from the overlap surface 482 between the P-doped region and the structured coating 480. Therefore, in the P-doped region 430, a concentrated casing with a lateral cadmium gradient is formed. The concentrated casing is automatically located in the P-doped region, thanks to the selective nature of the cadmium inter-diffusion (there is cadmium diffusion to the N-doped region, but it is negligible in relation to the cadmium diffusion to the P-doped region). In the concentrated casing, the cadmium concentration is maximum in relation to the overlap surface 482 between the P-doped region and the structured coating 480, then decreases on moving away from this overlap surface 482. The lateral cadmium concentration gradient makes it possible to define at least one intermediate gap zone and at least one high gap zone in the concentrated casing.

The cadmium level, and therefore the gap in the concentrated casing, is determined by the quantity of cadmium available in the structured coating, the dimensions of the overlap surface between the P-doped region and the structured coating, and the thermal balance associated with the inter-diffusion annealing (duration and temperature, defining cadmium diffusion lengths). The quantity of cadmium available in the structured coating and the dimensions of the overlap surface define particularly a maximum gap level threshold in the concentrated casing, which can under no circumstances be exceeded. This threshold effect also renders the gap gradient in the concentrated casing highly reproducible. It is particularly possible to obtain a minimum gap in the concentrated casing which is identical for all of the pixels of the same photo-detection device, and from one photo-detection device to another. Great homogeneity of the detection performances is thus ensured, from one pixel to another of the same device, even for large-sized devices with a very large number of pixels. Similarly, it is possible to ensure great homogeneity of the detection performances, from one device to another.

Thanks to the through openings in the structured coating, the cadmium level in the concentrated casing increases more slowly than if the annealing was carried out with a solid CdTe layer. In particular, a cadmium atom diffusion rate, from the structured coating to the P-doped region, is dependent on the dimensions of the overlap surface 482 between the structured coating 480 and the P-doped region 430. It will therefore be easier to ensure that the gap in the intermediate gap zone does not exceed a threshold limit beyond which it forms a potential barrier for charge carriers, since this threshold limit will be reached later, for a greater annealing time and/or a higher annealing temperature. The manufacturing method is therefore particularly robust, thanks in particular to a relaxation of constraints on the control of the inter-diffusion annealing conditions.

Figure 4B:
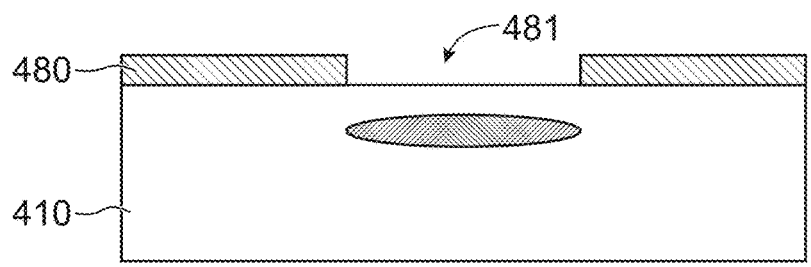
Figure 4C:
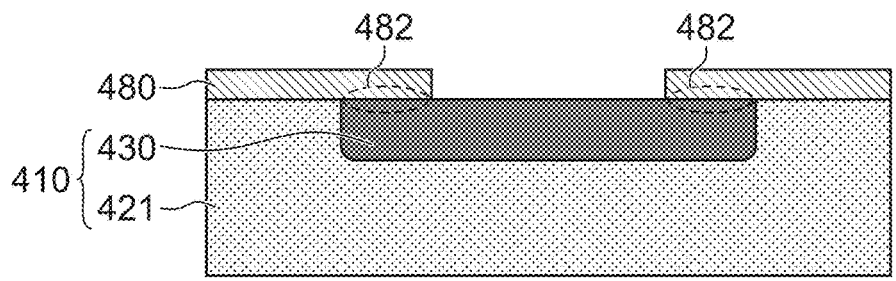
Figure 4D:
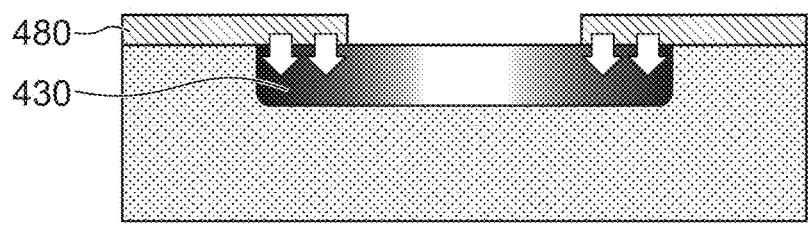
Figure 4E:
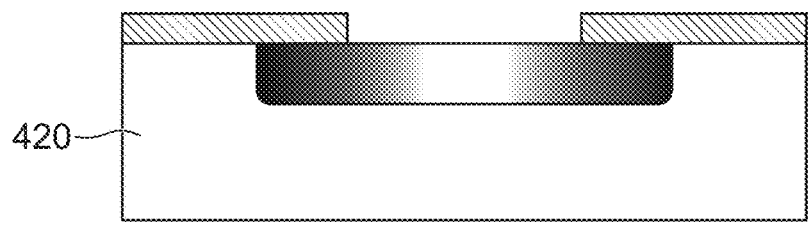

A further annealing is then carried out, under saturating mercury vapour pressure (FIG. 4E). This further annealing makes it possible to fill the mercury holes in the region 421. Following this annealing, the region 421 has an N-doping and forms the N-doped region 420 as described with reference to FIG. 1A. This further annealing is carried out at a temperature between 150° C. and 350° C., for example 250° C.

Figure 4F:
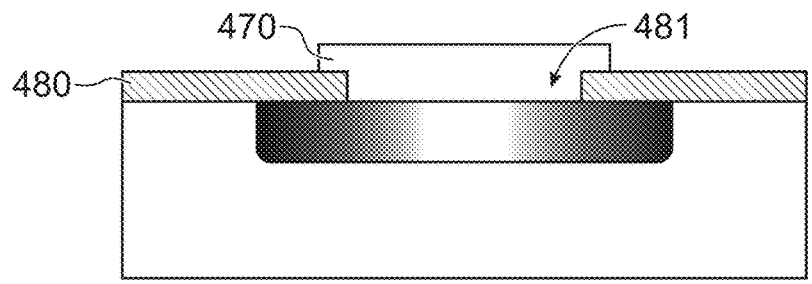

Then, metallisation is carried out in the opening 481 to form the electrical contact block 470 (FIG. 4F). The electrical contact block 470 thus finds itself automatically aligned with the low gap zone, for charge carrier collection.

A photo-detection device according to the invention is thus obtained. The structured coating is advantageously conserved in the final device, to form a passivation layer.

For clarity purposes, a distinction has been made between three annealing processes here, carrying out respectively the diffusion and activation of the doping elements, the cadmium inter-diffusion, and filling the mercury holes. It may be that one and/or the other of the doping element diffusion and activation annealing and the mercury hole filling annealing is also involved in the cadmium inter-diffusion. In this case, the cadmium level in the concentrated casing is determined particularly by the heat balance associated with the several annealing processes which are involved in cadmium inter-diffusion. Where applicable, the same annealing carries out at least two functions from doping element diffusion, doping element activation, cadmium inter-diffusion, and mercury hole filling.

The method according to the invention only requires a reduced number of steps, with no substantial alignment constraint. In particular, the concentrated casing is automatically located in the P-doped zone, and the electrical contact block is automatically aligned on the intermediate gap zone of the concentrated casing. A very good uniformity of the performances of the photo-detection device is thus obtained from one pixel to another of the same device, as well as a very good reproducibility of these performances from one device to another.

The various annealing processes, and more particularly the inter-diffusion annealing, have no influence on the cut-off wavelength of the photo-detection device obtained at the end of the method. Indeed, the cadmium atoms of the structured coating virtually do not diffuse in the N-doped region, and where applicable remain located in the vicinity of the top face of the substrate.

FIGS. 5A to 5E illustrate the steps of a second embodiment of a method according to the invention, which will only be described for the differences thereof in relation to the method in FIGS. 4A to 4B.

Figure 5A:
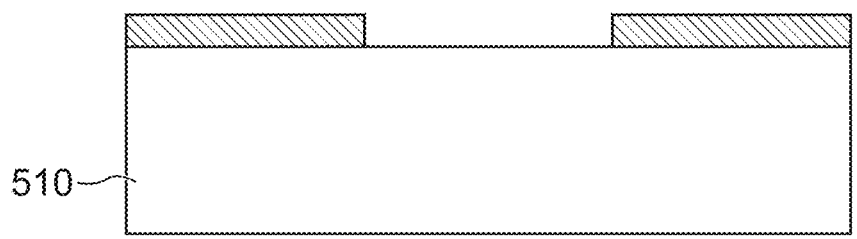
FIG. 5A, FIG. 5B, FIG. 5C, FIG. 5D and FIG. 5E illustrate the steps of a second embodiment of a method according to the invention.
Figure 5B:
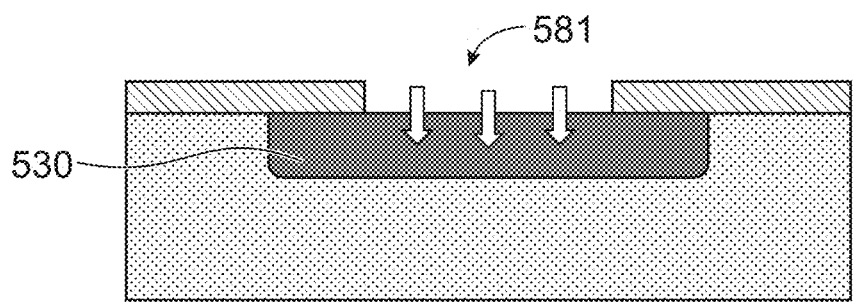

Here, the method starts by producing the structured coating 580 on the substrate 510 (FIG. 5A). Then, doping elements are injected into the substrate 510, via the through opening 581 of the structured coating 580 (FIG. 5B).

Here, the doping elements are injected into the substrate 510 using an annealing under saturating pressure of doping elements in vapour phase. This annealing carries out the injection of the doping elements into the substrate, and the diffusion thereof inside the substrate. Here, this annealing also carries out the activation of the doping elements in the substrate. Alternatively, the activation of the doping elements is carried out by a separate annealing. The P-doped region 530 thus obtained is therefore automatically aligned with the through opening 581 of the structured coating 580. The P-doped region 530 is here slightly wider than the through opening 581, due to the diffusion of the doping elements in the substrate.

Figure 5C:
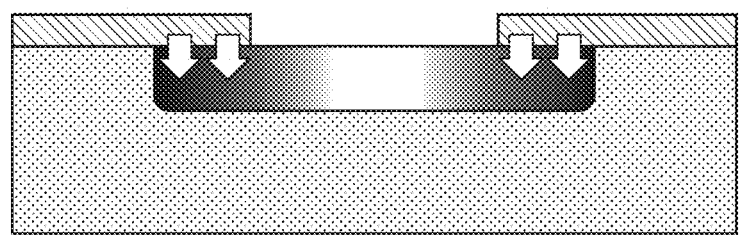
Figure 5D:
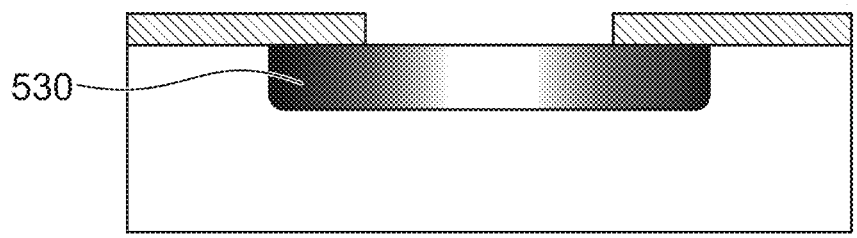
Figure 5E:
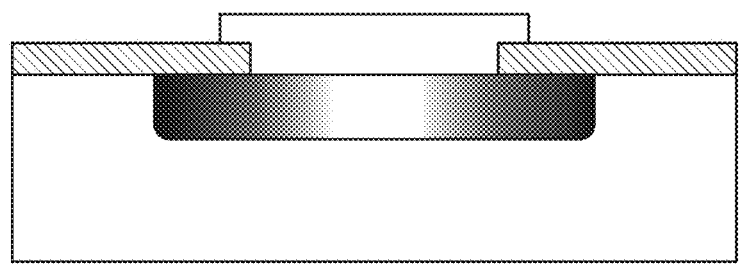

Then, the steps in FIGS. 5C to 5E correspond respectively to the steps of FIGS. 4D to 4F described above.

This second embodiment offers an automatic alignment of the through opening of the structured coating in relation to the P-doped region, particularly advantageous for reduced pixel intervals (for example less than or equal to 10 µm, which is frequently the case in infrared imaging). Furthermore, doping by annealing under saturating pressure of doping elements in vapour phase avoids the creation of defects in the substrate.

When the structured coating is used as a mask for injecting doping elements into the substrate, a distinction can be made between difference cases:

Case 1: The structured coating consists solely of the cadmium-rich material, and prevents the diffusion of the doping elements into the substrate (for example thanks to a large thickness and/or sealing of the doping elements in vapour phase). This is the scenario illustrated in FIG. 5B.

Figure 6:
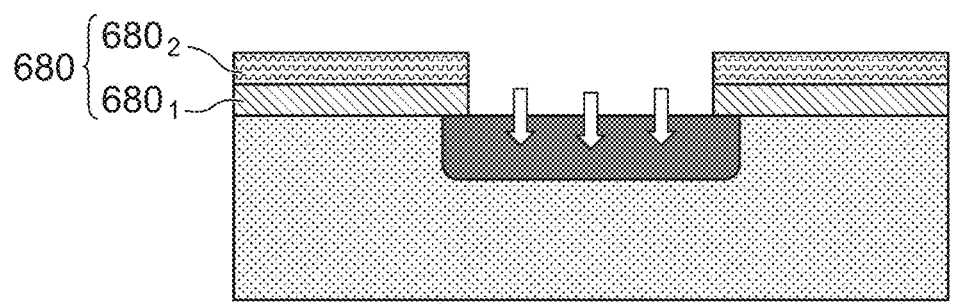
FIG. 6 illustrates schematically a first alternative embodiment of the method in FIGS. 5A to 5E.

Case 2: The structured coating includes two stacked layers, as illustrated in FIG. 6. A first layer $680_1$, rich in cadmium, covers the top face of the substrate directly and supplies the cadmium atoms which will diffuse in the substrate. A second layer $680_2$, known as the sealing layer, covering the first layer $680_1$ and impervious to doping elements in vapour phase. The second layer $680_2$ is not formed from the same set of chemical compounds as the first layer $680_1$. The second layer $680_2$ consists for example of ZnS, or of $SiO_x$. It can be formed by an etching mask used for etching through openings in the cadmium-rich layer $680_1$. The second layer $680_2$ can be conserved in the final device, or removed after injecting the doping elements into the substrate.

Figure 7:
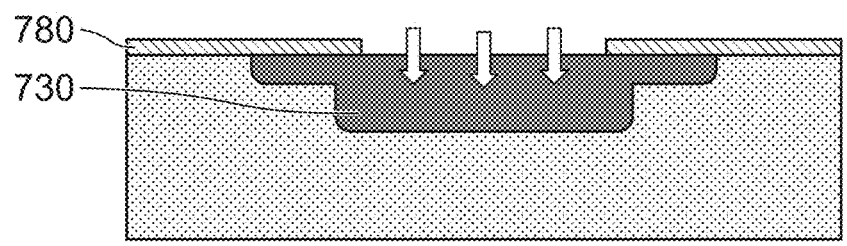
FIG. 7 illustrates schematically a second alternative embodiment of the method in FIG. 5A to 5E.

Case 3: In this case 3, the P-doped region is produced by ion implantation. The coating consists solely of cadmium-rich material. It is not impervious to doping elements in vapour phase, but it constitutes an extra thickness to be passed through for doping elements in vapour phase. The P-doped region therefore reproduces the topology of the structured coating 780, here with a central part having nominal depth and a peripheral part having reduced depth (see FIG. 7).

Figure 8A:
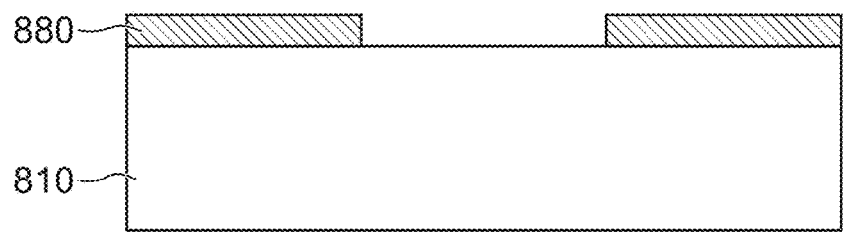
FIG. 8A and FIG. 8B illustrate schematically a third embodiment of a method according to the invention.
Figure 8B:
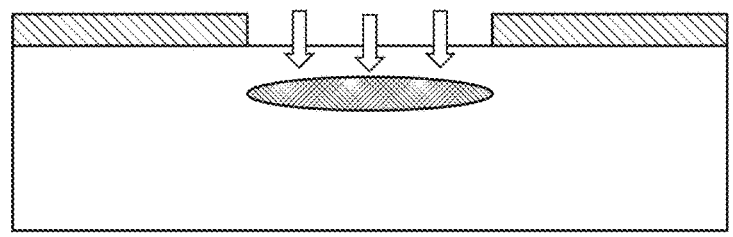

FIGS. 8A and 8B illustrate the first steps of a third embodiment of a method according to the invention, which will only be described for the differences thereof in relation to the method in FIGS. 4A to 4B. Here again, a step of producing the structured coating 880 (FIG. 8A) is implemented prior to injecting the doping elements in the substrate 810 (FIG. 8B), so as to carry out an automatic alignment of each through opening of the structured coating with a respective P-doped region. Here, the injection of doping elements is carried out by ion injection. The following steps are not illustrated, and correspond to the steps in FIGS. 4C to 4F. Here again, the structured coating can include a layer impervious to the doping elements, or be only partially impervious to the doping elements such that the P-doped region ultimately reproduces the topology of the structured coating.

In the different examples illustrated above, the photo-detection device has a planar configuration, with a substrate wherein the bottom and top faces are planar and parallel with one another. When the photo-detection device includes several pixels, the latter form a planar pixel array together.

Alternatively, the photo-detection device according to the invention can have a so-called mesa configuration, wherein each pixel is presented in the form of a so-called mesa block, surrounded by trenches. When the photo-detection device includes several pixels, the latter form a mesa pixel array together. The mesa array arrangement is advantageously combined with a concentrated casing as represented in FIGS. 2A and 2A', to obtain both a good modulation transfer function to the mesas, and a very low noise level thanks to the minimal volume of the intermediate gap zone.

Figure 9A:
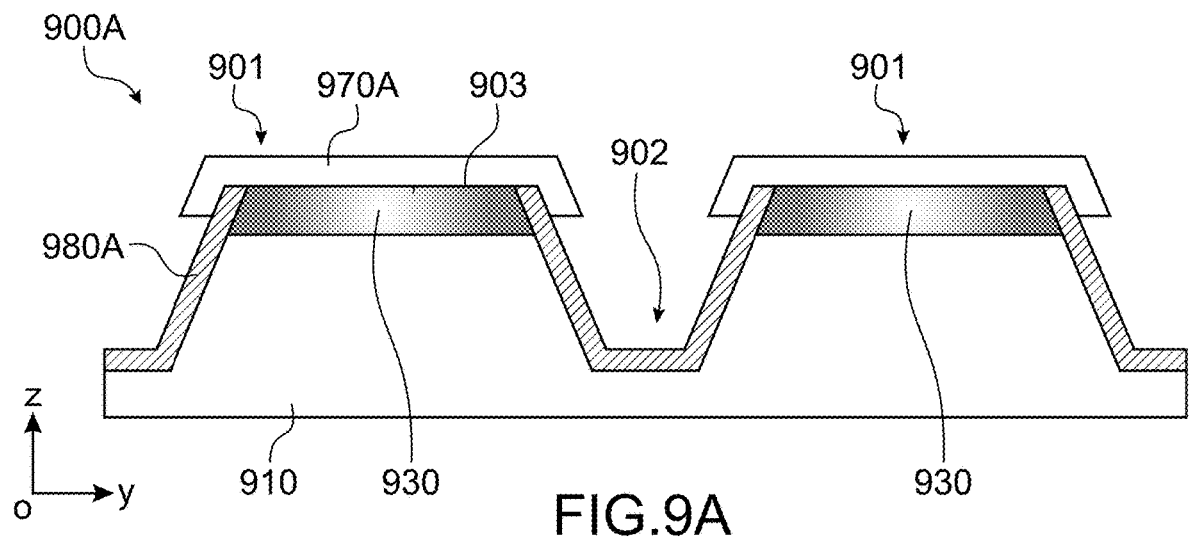
FIG. 9A illustrates schematically a third embodiment of a photo-detection device according to the invention, according to a sectional view in a transverse plane.
Figure 9B:
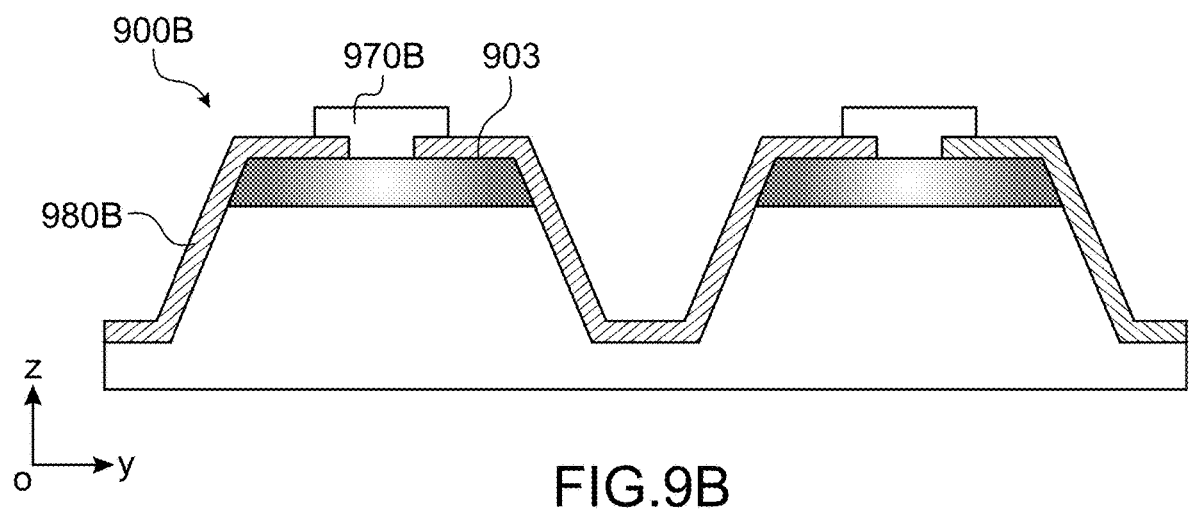
FIG. 9B illustrates schematically an alternative embodiment of the embodiment in FIG. 9A.

FIGS. 9A and 9B illustrate two examples of photo-detection devices according to the invention, with a mesa configuration, and according to a sectional view in a plane parallel with the plane (y0z). These two examples will only be described for the difference thereof with the first and second embodiments described above.

In the embodiment in FIG. 9A, the substrate 910 only differs from the substrate described with reference to FIG. 1A in that it has a mesa topology, with here two mesa blocks 901 separated by a trench 902. Each mesa block 901 defines a respective pixel of the photo-detection device 900A. Each mesa block 901 includes a base, on the side of the bottom of the trenches, and a top, on the side opposite the base. An interface between the mesa block and the surrounding medium, on the side of the top of the mesa block, is a planar surface 903 parallel with the plane (x0y).

Each mesa block includes a respective P-doped region 930, at the top of the mesa block. The P-doped region 930 includes a concentrated casing as described above. Here, the structured coating 980A covers the flanks of the mesa blocks and the bottom of the trenches, leaving the entirety of the respective planar surfaces 903 free, at the top of the mesa blocks. In each pixel, the electrical contact block 970B is in direct physical contact with the entire planar surface 903 of the same pixel, here also covering a part of the structured coating.

The method for manufacturing the photo-detection device 900A is described briefly hereinafter. The method starts with a wafer type planar substrate, whereon a resin mask is deposited. The planar substrate is etched through the resin mask, to form the trenches separating the mesa blocks therein (ion or chemical etching). The assembly obtained is covered with a cadmium-rich solid layer, plus where applicable a solid layer impervious to doping elements. On removing the resin mask, an assembly consisting of the substrate and the structured coating is obtained, with the substrate which has a mesa topology and the structured coating which only covers the bottom of the trenches and the flanks of the mesa blocks (lift-off technique). The method also includes producing PN junctions, each separating a respective P-doped region at the top of a mesa block, and an N-doped region including the bases of the several mesa blocks. Injecting doping elements into the substrate can be carried out after removing the resin mask, or before etching the planar substrate (in this second case, a planar substrate wherein an entire top zone is P-doped, and the several P-doped regions are delimited when etching the mesa blocks). The method also includes a step of annealing the assembly consisting of the substrate and the structured coating is obtained, with the substrate which has a mesa topology and the structured coating which only covers the bottom of the trenches and the flanks of the mesa blocks. During this annealing, the cadmium of the structured coating diffuses to the P-doped regions, from the surfaces located on the flanks of the corresponding mesa blocks.

FIG. 9B illustrates an alternative embodiment of the embodiment in FIG. 9A. The photo-detection device 900B in FIG. 9B only differs from that in FIG. 9A in that the structured coating 980B covers the flanks of the mesa blocks, the bottom of the trenches, and a peripheral zone of the planar surface 903 at the top of the mesa block, only leaving a central zone of said planar surface 903 free. The electrical contact block 970B is in direct physical contact with said peripheral zone of the planar surface 903, here also covering a part of the structured coating.

A manufacturing method associated with the alternative embodiment in FIG. 9B is similar to the methods described above with reference to FIGS. 4A to 8B, apart from an additional preliminary step of etching a planar substrate to form mesa blocks separated by trenches therein.

The alternative embodiment in FIG. 9B corresponds to the example in FIGS. 2A and 2A', in a mesa topology. Numerous other alternative embodiments can be implemented, with in each pixel one or more through openings in the structured coating, for example alternative embodiments corresponding to the examples in FIGS. 2B, 2B', respectively 2C, 2C', in a mesa topology.

The invention thus relates to a device having at least one P/N photodiode, wherein each photodiode includes a three-dimensional heterostructure (concentrated casing) having a lateral gap gradient. The invention also relates to a method for manufacturing such a device, using a structured layer forming a cadmium reservoir and a selective inter-diffusion annealing.

The invention is not limited to the examples of devices and methods described above, and numerous alternative embodiments can be implemented without leaving the scope of the invention, for example with a different number of intermediate gap zone(s) in the concentrated casing distributed in different ways therein. According to further alternative embodiments, the through opening in the structure is substantially decentred relative to the P-doped region, such that the intermediate gap zone is not surrounded by the high gap zone, but merely adjacent thereto. The $Cd_xHg_{1-x}Te$ substrate can rest on a support, advantageously transparent to the wavelengths to be detected.

The invention claimed is:

1. A photo-detection device having at least one pixel, including a semiconductor substrate made of $Cd_xHg_{1-x}Te$, said substrate including for each pixel:
   an N-doped region, dedicated to the absorption of incident photons;
   a P-doped region, forming a PN junction with the N-doped region and flush with a top face of the substrate;
   an electrical contact block, made of metal, in direct physical contact with the P-doped region; and
   a concentrated casing, only located in the P-doped region and having an average cadmium concentration greater than the average cadmium concentration in the N-doped region;
wherein in each pixel:
   the concentrated casing has a cadmium concentration gradient, defining therein at least one intermediate gap zone and at least one high gap zone;
   the intermediate gap zone has an average cadmium concentration strictly less than the average cadmium concentration in the high gap zone; and
   each intermediate gap zone is in direct physical contact with the electrical contact block.

2. The photo-detection device of claim 1, further including a structured coating covering the top face of the substrate, and wherein:
   the structured coating includes a cadmium-rich layer, consisting of an alloy comprising cadmium and in direct physical contact with the semiconductor substrate;
   the structured coating includes at least one through opening; and
   in each pixel, each intermediate gap zone of the concentrated casing is topped with a respective through opening of the structured coating.

3. The photo-detection device of claim 2, wherein the structured coating includes several stacked layers, including a sealing layer, separate from the cadmium-rich layer and capable of blocking the passage of doping elements inside the semiconductor substrate.

4. The photo-detection device of claim 2, including at least two pixels, each pixel including the same number of through opening(s) in the structured coating, distributed in the same way on the pixel and having the same dimensions from one pixel to another.

5. The photo-detection device of claim 1, wherein in each pixel, each intermediate gap zone is surrounded laterally by at least a part of the at least one high gap zone.

6. The photo-detection device of claim 5, wherein in at least one pixel, the concentrated casing comprises a single intermediate gap zone and a single high gap zone, with the single intermediate gap zone surrounded laterally by the single high gap zone.

7. The photo-detection device of claim 5, wherein in at least one pixel, the concentrated casing comprises a single intermediate gap zone and two high gap zones, with the intermediate gap zone which forms an open volume at the centre and with the two high gap zones respectively around and at the centre of the intermediate gap zone.

8. The photo-detection device of claim 5, wherein in at least one pixel, the concentrated casing comprises a plurality of intermediate gap zones, and a high gap zone which extends around and between the intermediate gap zones.

9. The photo-detection device of claim 1, wherein in each pixel, the minimum cadmium concentration value in the concentrated casing is strictly greater than the minimum cadmium concentration value in the N-doped region.

10. The photo-detection device of claim 1, including a plurality of pixels which all have the same cut-off wavelength.

11. The photo-detection device of claim 1, wherein the semiconductor substrate has a mesa topology, with, in each pixel, a respective mesa block receiving the P-doped region.

12. A method for manufacturing the photo-detection device of claim 1, comprising the following steps:
   a) producing, on the semiconductor substrate, a structured coating including at least one through opening, with said structured coating which includes a cadmium-rich layer, consisting of an alloy comprising cadmium and in direct physical contact with the semiconductor substrate;
   b) annealing the whole including the semiconductor substrate and the structured coating;
the method further comprising producing, in each pixel, a PN junction which separates the N-doped region and the P-doped region, with the P-doped region located in relation to at least one from the at least one through opening of the structured coating, and the annealing carrying out a selective inter-diffusion of the cadmium from the structured coating to the P-doped region of each pixel.

13. The method of claim 12, wherein in each pixel, producing the PN junction advantageously includes a step of injecting doping elements into the semiconductor substrate, this step being carried out after step a) and the doping elements being injected through at least one through opening of the structured coating.

14. The method of claim 13, wherein the structured coating includes several stacked layers, including a sealing layer, separate from the cadmium-rich layer and capable of blocking the passage of doping elements inside the semiconductor substrate.

15. The method of claim 12, further including, for each pixel, a step of producing the electrical contact block carried out after step b), with the electrical contact block which extends into each through opening of the structured coating in said pixel.

\* \* \* \* \*